United States Patent
Cho et al.

(10) Patent No.: US 8,647,394 B2
(45) Date of Patent: Feb. 11, 2014

(54) METHOD OF FABRICATING CIS OR CIGS THIN FILM

(75) Inventors: Jung-Min Cho, Busan (KR); Eun-Jin Bae, Daejeon (KR); Ki-Bong Song, Daejeon (KR); Jeong-Dae Suh, Daejeon (KR); Myung-Ae Chung, Daejeon (KR)

(73) Assignee: Intellectual Discovery Co., Ltd., Seoul (KR)

( * ) Notice: Subject to any disclaimer, the term of this patent is extended or adjusted under 35 U.S.C. 154(b) by 431 days.

(21) Appl. No.: 13/070,099

(22) Filed: Mar. 23, 2011

(65) Prior Publication Data

US 2012/0051998 A1 Mar. 1, 2012

(30) Foreign Application Priority Data

Aug. 24, 2010 (KR) .................. 10-2010-0081774

(51) Int. Cl.
*C01D 3/00* (2006.01)
(52) U.S. Cl.
USPC ........................................ 23/303; 423/511
(58) Field of Classification Search
USPC .............. 423/511, 561.1, 557; 23/303, 295 R
See application file for complete search history.

(56) References Cited

FOREIGN PATENT DOCUMENTS

| KR | 10-0588604 | 6/2006 |
| KR | 10-2008-0009345 | 1/2008 |
| KR | 10-2009-0121660 | 11/2009 |

OTHER PUBLICATIONS

Chris Eberspacher et al., "Thin-film CIS alloy PV materials fabricated using non-vacuum, particles-based techniques," Thin Solid Films, 2001; 5 pages.
Sho Shirakata et al., "Properties of Cu(In,Ga)Se$_2$ Thin Films Prepared by Chemical Spray Pyrolysis,", Japanese Journal of Applied Physics, vol. 38, 1999, pp. 4997-5002.
David B. Mitzi et al., "A High-Efficiency Solution-Deposited Thin-Film Photovoltaic Device," Advanced Materials, 2008, pp. 3657-3662.
Korean Office Action mailed Sep. 12, 2013 in corresponding Korean Application No. 10-2010-0081774.

*Primary Examiner* — Edward Johnson
(74) *Attorney, Agent, or Firm* — Staas & Halsey LLP

(57) ABSTRACT

Disclosed herein is a method of fabricating a CIS or CIGS thin film, comprising:

forming, on a substrate, a seed particle layer comprising copper-indium-compound seed particles comprising copper (Cu); indium (In); and at least one selected from the group consisting of gallium (Ga), sulfur (S) and selenium (Se), applying, on the seed particle layer, a water-soluble precursor solution comprising:
a water-soluble copper (Cu) precursor;
a water-soluble indium (In) precursor; and
at least one selected from the group consisting of a water-soluble gallium (Ga) precursor, a water-soluble sulfur (S) precursor and a water-soluble selenium (Se) precursor, and forming a thin film at high temperature.

13 Claims, 3 Drawing Sheets

METHOD OF FABRICATING CIS OR CIGS THIN FILM

CROSS REFERENCE TO RELATED APPLICATION

This application claims the benefit of Korean Patent Application No. 10-2010-0081774, filed Aug. 24, 2010, entitled "Method for Fabricating a CIS or CIGS Thin Film," which is hereby incorporated by reference in its entirety into this application.

BACKGROUND OF THE INVENTION

1. Technical Field

The present invention relates to a method of fabricating a CIS or CIGS thin film.

2. Description of the Related Art

In solar cells, the efficiency with which light energy is converted into electric energy is regarded as being of the utmost importance. Increasing the conversion efficiency of solar cells is still being thoroughly researched and many investments are still being made into the development of novel materials.

Currently, there are the illustrative examples of thin-film solar cells using CIS (Copper Indium Selenium, Copper Indium Sulfur or Copper Indium Selenium Sulfur) or CIGS (Copper Indium Gallium Selenium, Copper Indium Gallium Sulfur or Copper Indium Gallium Selenium Sulfur) thin films that exhibit the greatest efficiency. A variety of techniques are known to be used to fabricate a CIS or CIGS thin film.

For example, Korean Patent No. 10-0588604 discloses a method of simply and conveniently synthesizing $Cu(In_xGa_{1-x})(Se_yS_{1-y})_2$ nanoparticles adapted to fabricate a CIGS thin film used as a light absorber layer of a solar cell. In addition, a method of fabricating a CIGS thin film using screen printing is revealed in the "Thin-film CIS alloy PV materials fabricated using non-vacuum, particles-based techniques," Thin Solid Films Vol 387, 18-22 (2001). In addition, a method of fabricating a CIGS thin film using spin coating is revealed in the "Properties of Cu(In, Ga)Se2 Thin Films Prepared by Chemical Spray Pyrolysis," Jpn. J. Appl. Phys. Vol 38, 4997-5002, 1999. In addition, a method of fabricating a CIGS thin film using a CIGS solution precursor is known in the "A High-Efficiency Solution-Deposited Thin-Film Photovoltaic Device," Adv. Mat, 2008, 9999, 1-6.

However, such methods of fabricating a CIGS thin film are disadvantageous because they involve limitations on how cheaply a uniform thin film can be formed using them, and it is difficult to achieve high optical efficiency.

SUMMARY OF THE INVENTION

Accordingly, the present invention has been made keeping in mind the above problems occurring in the related art, and an object of the present invention is to provide a method of fabricating a uniform CIS or CIGS thin film even under comparatively low temperature and non-vacuum conditions.

Another object of the present invention is to provide a method of simply fabricating a CIS or CIGS thin film having high optical efficiency at low cost.

Still another object of the present invention is to provide a method of fabricating a CIS or CIGS thin film which is less contaminated by impurities.

Still another object of the present invention is to provide a method of fabricating a CIS or CIGS thin film having a form and phase of any type by easily adjusting the composition of a solution, the concentration of impurities, and the reaction time and temperature.

Still another object of the present invention is to provide a method of fabricating a CIS or CIGS thin film, which is able to control the particle size of the thin film, the form of crystals, and the thickness of the thin film.

Still another object of the present invention is to provide a method of fabricating a CIS or CIGS thin film usable as a semiconductor layer of a solar cell.

In order to accomplish the above objects, the present invention provides a method of fabricating a CIS or CIGS thin film, comprising:

forming, on a substrate, a seed particle layer comprising copper-indium-compound seed particles comprising copper; indium; and at least one selected from the group consisting of gallium, sulfur and selenium;

applying, on the seed particle layer, a water-soluble precursor solution comprising:
 a water-soluble copper precursor;
 a water-soluble indium precursor; and
 at least one selected from the group consisting of a water-soluble gallium precursor, a water-soluble sulfur precursor and a water-soluble selenium precursor, and
 forming a thin film at high temperature.

Also the present invention provides a CIS or CIGS thin film fabricated using the above method.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Figure 1:
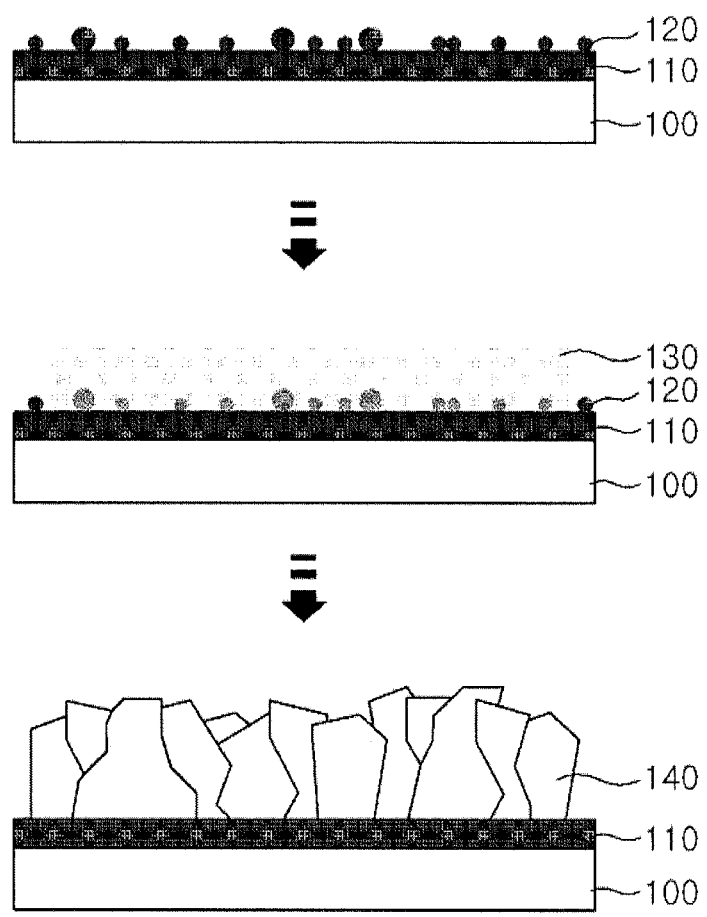
FIG. 1 is of cross-sectional views showing a process of fabricating a thin film according to an embodiment of the present invention.

If in the specification, detailed descriptions of well-known functions or configurations may unnecessarily make the gist of the present invention obscure, the detailed descriptions will be omitted.

The terms and words used in the present specification and the accompanying claims should not be limitedly interpreted as having their common meanings or those found in dictionaries, but should be interpreted as having meanings adapted to the technical spirit of the present invention on the basis of the principle that an inventor can appropriately define the concepts of terms in order to best describe his or her invention.

It should be noted that the same reference numerals are used throughout the different drawings to designate the same or similar components as much as possible.

FIG. 1 is of cross-sectional views showing a process of fabricating a CIS or CIGS thin film according to the present invention.

As shown in FIG. 1, the method of fabricating a CIS or CIGS thin film according to the present invention comprises forming a seed particle layer 120 comprising copper-indium-compound seed particles comprising copper (Cu); indium (In); and at least one selected from the group consisting of gallium (Ga), sulfur (S) and selenium (Se) on a substrate 100.

The substrate 100 is not particularly limited so long as it is used in the art, but may be a substrate made of glass, metal, silicon or polymer resin. The substrate 100 may be ultrasonically cleaned using acetone, alcohol or a solution which is a mixture thereof.

The seed particle layer 120 may be formed over the entire surface of the substrate 100, or a layer where the seed particles have been partially formed.

The copper-indium-compound seed particles of the seed particle layer 120 are preferably selected from the group consisting of $CuInS_2$, $CuInSe_2$, $Cu(In,Ga)S_2$, $Cu(In,Ga)Se_2$ and $Cu(In,Ga)(S,Se)_2$.

The seed particle layer 120 may further comprise additional seed particles, in addition to the copper-indium-compound seed particles. Typically useful are silica ($SiO_2$) nanoparticles. Also an example of the additional seed particles may include a metal oxide or a metal, provided that the size thereof is preferably on the nano scale.

The seed particle layer 120 may be formed by subjecting the copper-indium-compound seed particles to physical vapor deposition or chemical vapor deposition. Alternatively, the seed particle layer 120 may be formed by subjecting a solution comprising a copper indium compound to spin coating, dipping or spray coating.

The solution comprising a copper indium compound may be a solution in which a water-soluble precursor of the copper-indium-compound seed particles is completely dissolved, or a solution in which the copper-indium-compound seed particles are uniformly dispersed on the nano scale. As such, the solvent preferably includes an inorganic solvent, an organic solvent, or a mixture thereof. The inorganic solvent is not particularly limited so long as it is used in the art, but examples thereof may include water, ammonia water, hydrochloric acid, nitric acid, sulfuric acid and acetic acid. The organic solvent is not particularly limited so long as it is used in the art, but examples thereof may include diethylamine, triethylamine, a bis[tetrakis(hydroxymethyl)phosphonium]sulfate solution, a tetrakis(hydroxymethyl)phosphonium chloride solution, a tetrakis[tris(dimethylamino)phosphoranylidenamino]phosphonium fluoride, a ketone-based organic solvent, an alcohol-based organic solvent, an aldehyde-based organic solvent, and an acetate-based organic solvent.

Meanwhile, the concentration of the water-soluble precursor solution is preferably set to be lower than that of the solution comprising the seed particles, but the present invention is not limited thereto. In some cases, a water-soluble precursor solution which has a higher concentration than that of the solution comprising the seed particles may be used.

When the method of fabricating a CIS or CIGS thin film according to the present invention is applied to a solar cell, a first electrode layer 110 is preferably formed before forming the seed particle layer 120 on the substrate 100. A material of the first electrode layer 110 is not particularly limited so long as it is electrically conductive in the art, but an example thereof may include molybdenum which has high electrical conductivity, enables ohmic junction with a chalcogenide compound and is very stable at high temperature.

The method of fabricating a CIS or CIGS thin film according to the present invention comprises applying a water-soluble precursor solution 130 comprising a water-soluble Cu precursor; a water-soluble In precursor; and at least one selected from the group consisting of a water-soluble Ga precursor, a water-soluble S precursor and a water-soluble Se precursor on the seed particle layer 120.

The water-soluble Cu precursor is preferably selected from the group consisting of $CuCl_2$, $Cu(NO_3)_2$, $CuSO_4$, $Cu(CH_3COO)_2$ and hydrates thereof. The water-soluble In precursor is preferably selected from the group consisting of $InCl_3$, $In(NO_3)_3$, $In(CH_3COO)_3$, $In_2(SO_4)_3$ and hydrates thereof. The water-soluble Ga precursor is preferably selected from the group consisting of $GaCl_3$, $Ga(NO_3)_3$, $GaI_3$ and hydrates thereof. The water-soluble S precursor is preferably $(NH_2)_2CS$ or a hydrate thereof. The water-soluble Se precursor is preferably selected from the group consisting of $(NH_2)_2CSe$, $SeO_2$, $H_2SeO_3$, $SeCl_4$ and hydrates thereof.

In addition to the aforementioned water-soluble Cu, In, Ga, S, and Se precursors, useful is a chloride type water-soluble precursor, a nitride type water-soluble precursor, a sulfide type water-soluble precursor, or an acetate type water-soluble precursor, each of which comprises CIS or CIGS components. As such, the water-soluble precursors are preferably materials which may be mixed in a uniform state like sol to be dispersed.

The water-soluble precursor solution 130 comprises an organic solvent and/or an inorganic solvent as the solvent. Particularly useful as the solvent is water which is an inorganic solvent. Alternatively, a mixture of water and a small amount of organic solvent such as alcohol, aldehyde or ketone may be used.

The volume ratio of the water-soluble precursor to the solvent in the solution may vary depending on the crystal size and shape of the thin film particles, and is preferably set to the range from 1:1 to 1:10,000.

The water-soluble precursor solution 130 may further comprise a structure directing agent in order to accelerate the reaction rate or to synthesize a thin film having a specific particle shape or size.

The structure directing agent is preferably used in an amount of 0.05~0.5 mol per 1 mol of the water-soluble precursor. If the amount of this component is less than the above lower limit, the structure directing agent exhibits no effects. In contrast, if the amount thereof exceeds the above upper limit, the thin film fabrication cost may increase, and a compound harmful to the environment and humans may be produced in the course of performing thermal treatment.

The structure directing agent is preferably an organic structure directing agent. The number of carbons substituted for in the organic structure directing agent is appropriately 1~6. Taking into consideration the impurity content in the thin film, the use of a structure directing agent having a carbon content as low as possible is favorable in terms of synthesizing a high-quality thin film.

More preferably, the structure directing agent is selected from among nitrogen type, phosphorus type, alcohol type, ketone type and aldehyde type organic structure directing agents. Examples of the nitrogen type organic structure directing agent include TPAOH (Tetrapropylammonium Hydroxide), dimethyl amine, trimethyl amine, etc. Examples of the phosphorus type organic structure directing agent include bis[tetrakis(hydroxymethyl)phosphonium]sulfate, tetrakis (hydroxymethyl)phosphonium chloride, tetrakis[tris (dimethylamino)phosphoranylidenamino]phosphonium fluoride, etc. Examples of the alcohol type organic structure directing agent include methanol, ethanol, isobutanol, etc.

The method of fabricating a CIS or CIGS thin film according to the present invention includes forming a thin film 140 at high temperature.

The formation of the applied solution 130 into a thin film at high temperature is preferably carried out using a hydrothermal synthesis process. When the hydrothermal synthesis process is used, the metal ions of the water-soluble precursor present in the applied solution 130 react with oxygen or hydroxide ions of water, thus forming the thin film 140 which is crystallized to have a uniform particle size distribution. Specifically, the crystallization occurs from seed particles of the seed particle layer 120. The water-soluble precursor included in the applied solution 130 induces or accelerates crystallization. The water-soluble precursor is repetitively subjected to crystallization and re-dissolution by change of the reaction temperature and pressure to possibly result in the crystallized thin film 140.

In the case where the applied solution 130 comprises an excess of Se precursor, the reaction may take place more competitively.

The hydrothermal synthesis process enables the thin film to be synthesized at comparatively low temperature, and is able to form the thin film at comparatively low cost because it is not performed in a vacuum. Even when the process is performed in a non-vacuum atmosphere, contamination by impurities becomes comparatively small.

The hydrothermal synthesis process is preferably carried out at 70~250° C. for 1~175 hours in order to reduce the amount of energy used and production cost. Furthermore, the hydrothermal synthesis process is preferably performed by changing the temperature two or more times. If the temperature is changed two or more times, low temperature is applied before crystallization, and then when crystallization begins, a higher temperature than the temperature before crystallization may be applied. Specifically, the reaction temperature conditions may include, starting from room temperature, a first step at 80~120° C. and a second step at 160~200° C. The first step is where primary particles are formed based on the seed particles in the water-soluble precursor solution 130. The second step is where the primary particles formed in the high-temperature reaction grow.

Also, an additional element may be further added when the thin film is forming. The additional element can be any element of the periodic table, and preferably includes an element of the same group as Cu, In, Ga, Se.

The method of fabricating a CIS or CIGS thin film according to the present invention may further comprise performing thermal treatment in order to increase crystallinity of the thin film. The thermal treatment is preferably performed at 250~650° C. for 1~12 hours. The thermal treatment may also be performed by changing the temperature at least two times. If the temperature is changed at least two times, the initial thermal treatment may be performed at low temperature, and post thermal treatment may be performed at a temperature higher than the initial thermal treatment temperature.

In addition, the present invention provides a CIS or CIGS thin film fabricated using the above method.

The method of fabricating a CIS or CIGS thin film according to the present invention enables the fabrication of a uniform CIS or CIGS thin film even under comparatively low temperature and non-vacuum conditions. Also, the method of fabricating a CIS or CIGS thin film according to the present invention enables the simple fabrication of a thin film having high optical efficiency at low cost. Also, the method of fabricating a CIS or CIGS thin film according to the present invention entails a comparatively small amount of contamination by impurities. Also, the method of fabricating a CIS or CIGS thin film according to the present invention makes it easy to adjust the composition of the solution, the concentration of impurities, and the reaction time and temperature to thereby result in a thin film having a form and phase of any type. Also, the method of fabricating a CIS or CIGS thin film according to the present invention can control the particle size of the thin film, the form of crystals, and the thickness of the thin film. Also, the method of fabricating a CIS or CIGS thin film according to the present invention can be utilized to manufacture the semiconductor layer of a solar cell.

The following examples are set forth to illustrate, but are not to be construed as limiting the present invention, and may provide a better understanding of the present invention.

Example 1 and Comparative Example 1

Fabrication of CIGS Thin Film

Example 1

Fabrication of CIGS Thin Film Using Hydrothermal Synthesis $Cu(In,Ga)(S,Se)_2$ nanoparticles were applied using spin coating on a glass substrate on which molybdenum had been deposited at a thickness of 1 μm, thus forming a seed particle layer.

Also, $CuCl_2$, $InCl_3$, $GaCl_3$, and $SeC(NH_2)_2$ were mixed at a molar ratio of 1:1:1:4 in distilled water to prepare a sample solution, which was then vigorously stirred for about 30 min and became homogeneous. Thereafter, the substrate having the seed particle layer formed thereon was located at the bottom of a Teflon vessel, and then 80% of the vessel was filled with the stirred sample solution. Subsequently, the Teflon vessel was placed in an autoclave made of stainless steel, so that hydrothermal synthesis was carried out at 150° C. for 18 hours, thereby fabricating a CIGS thin film.

Figure 2:
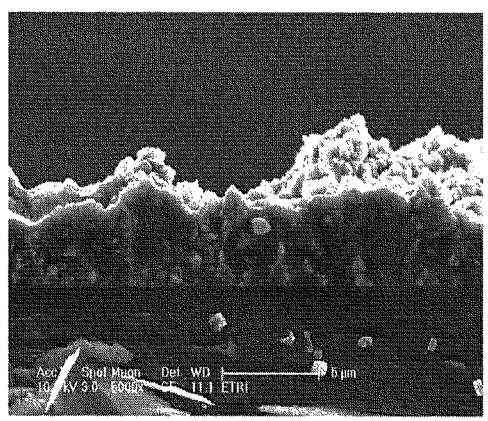
FIG. 2 is a scanning electron microscope (SEM) image showing seed particles into which a precursor solution has penetrated during hydrothermal synthesis, upon fabrication of the thin film of Example 1.
Figure 3:
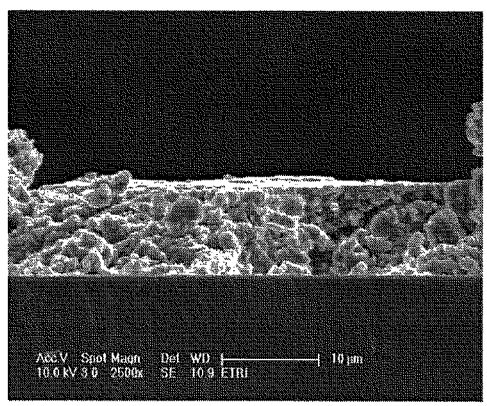
FIG. 3 is an SEM image showing the synthesized thin film after termination of hydrothermal synthesis, upon fabrication of the thin film of Example 1.

FIG. 2 is an SEM image showing the seed particles into which the precursor solution has penetrated during hydrothermal synthesis, upon fabrication of the thin film of Example 1, and FIG. 3 is an SEM image showing the synthesized thin film after termination of hydrothermal synthesis.

With reference to FIGS. 2 and 3, it can be seen that the thin film is not uniform during the hydrothermal synthesis, but, after termination of hydrothermal synthesis, a thin film the surface of which is even is fabricated.

Comparative Example 1

Fabrication of CIGS Thin Film Using Spin Coating $Cu(In,Ga)(S,Se)_2$ nanoparticles were applied using doctor blading on a glass substrate on which molybdenum had been deposited at a thickness of 1 μm, thus forming a thin film layer. Also, $CuCl_2$, $GaCl_3$, $InCl_3$, $SeC(NH_2)_2$ were mixed at a molar ratio of 8:3:1:16 in ethanol thus preparing a sample, which was then blended with 10 g of α-terpienol to prepare a viscous precursor solution. Subsequently, the precursor solution was applied using doctor blading and then thermally treated at 500° C. for 6 hours, thereby fabricating a CIGS thin film.

Figure 4:
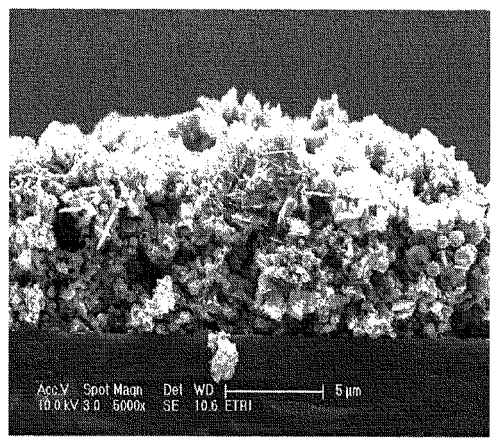
FIG. 4 is an SEM image showing the thin film of Comparative Example 1.

FIG. 4 is an SEM image showing the thin film of Comparative Example 1.

As shown in FIG. 4, a uniform thin film is not formed.

As described above, the present invention provides a method of fabricating a CIS or CIGS thin film. According to the present invention, a uniform CIS or CIGS thin film can be fabricated even under comparatively low temperature and non-vacuum conditions. Also, according to the present invention, a thin film having high optical efficiency can be simply fabricated at low cost. Also, according to the present invention, there is comparatively a small amount of contamination by impurities. Also, according to the present invention, a thin film having a form and phase of any type can be fabricated because it is easy to adjust the composition of the solution, the concentration of impurities, and the reaction time and temperature. Also, according to the present invention, the particle size of the thin film, the form of crystals, and the thickness of the thin film can be controlled. Also, the method of fabricating a CIS or CIGS thin film according to the present invention can be utilized to manufacture the semiconductor layer of a solar cell.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method of fabricating a CIS or CIGS thin film, comprising:
    forming, on a substrate, a seed particle layer comprising copper-indium-compound seed particles comprising copper (Cu); indium (In); and at least one selected from the group consisting of gallium (Ga), sulfur (S) and selenium (Se);
    applying, on the seed particle layer, a water-soluble precursor solution comprising:
        a water-soluble copper (Cu) precursor;
        a water-soluble indium (In) precursor; and
        at least one selected from the group consisting of a water-soluble gallium (Ga) precursor, a water-soluble sulfur (S) precursor and a water-soluble selenium (Se) precursor; and
    forming a thin film at high temperature.

2. The method as set forth in claim 1, wherein the copper-indium-compound seed particles are selected from the group consisting of $CuInS_2$, $CuInSe_2$, $Cu(In,Ga)S_2$, $Cu(In,Ga)Se_2$ and $Cu(In, Ga)(S, Se)_2$.

3. The method as set forth in claim 1, wherein the water-soluble copper (Cu) precursor is selected from the group consisting of $CuCl_2$, $Cu(NO_3)_2$, $CuSO_4$, $Cu(CH_3COO)_2$ and hydrates thereof.

4. The method as set forth in claim 1, wherein the water-soluble indium (In) precursor is selected from the group consisting of $InCl_3$, $In(NO_3)_3$, $In(CH_3COO)_3$, $In_2(SO_4)_3$ and hydrates thereof.

5. The method as set forth in claim 1, wherein the water-soluble gallium (Ga) precursor is selected from the group consisting of $GaCl_3$, $Ga(NO_3)_3$, $GaI_3$ and hydrates thereof.

6. The method as set forth in claim 1, wherein the water-soluble sulfur (S) precursor is $(NH_2)_2CS$ or a hydrate thereof.

7. The method as set forth in claim 1, wherein the water-soluble selenium (Se) precursor is selected from the group consisting of $(NH_2)_2CSe$, $SeO_2$, $H_2SeO_3$, $SeCl_4$ and hydrates thereof.

8. The method as set forth in claim 1, wherein the solution includes water or a buffer.

9. The method as set forth in claim 8, wherein a volume ratio of the water-soluble precursor to the water or buffer of the solution ranges from 1:1 to 1:10,000.

10. The method as set forth in claim 1, wherein the solution further comprises a structure directing agent.

11. The method as set forth in claim 1, wherein the forming the thin film at high temperature is performed using hydrothermal synthesis.

12. The method as set forth in claim 11, wherein the forming the thin film using hydrothermal synthesis is performed at 70~250° C. for 1~175 hours.

13. A CIS or CIGS thin film fabricated using the method of claim 1.

* * * * *